Jan. 24, 1967 C. H. FLURSCHEIM ET AL 3,300,609

SWITCHGEAR FOR HIGH VOLTAGE POWER CIRCUITS WITH REMOVABLE VACUUM SWITCH UNITS

Filed May 11, 1964 9 Sheets-Sheet 4

United States Patent Office 3,300,609

Patented Jan. 24, 1967

3,300,609

SWITCHGEAR FOR HIGH VOLTAGE POWER CIRCUITS WITH REMOVABLE VACUUM SWITCH UNITS

Cedric Harald Flurscheim, Hale, and Albert Roxburgh, Stanmore, Middlesex, England, assignors to Associated Electrical Industries Limited, London, England, a British company Filed May 11, 1964, Ser. No. 366,324
Claims priority, application Great Britain, May 15, 1963, 19,362/63; Jan. 22, 1964, 2,796/64
5 Claims. (Cl. 200—145)

This invention relates to switchgear for high voltage circuits and aims at providing an improved arrangement capable to control power circuits and using vacuum switches arranged in a manner to ensure effective and safe operation with comparatively compact and light-weight constructions so that a saving can be achieved in space, material and costs, as compared with those of conventional switchgear for simliar duties.

Accordingly the present invention resides in a power switchgear for high voltage circuits comprising a number of series connected vacuum switches, each having at least one pair of separable contacts contained in an envelope of insulating material, the said envelopes being insulated from earth by a common means.

The common insulating means may be a solid body comprising a hollow column for instance, or a fluid that is a quantity of a gas or oil contained in an earthed tank of metal, for instance, or both.

A common means for operating the several switches can be of mechanical, hydraulic or pneumatic nature. A fluid insulating the envelopes may serve also to transmit a change of pressure for switch operation. The solid insulator may comprise a column of a ceramic or vitreous material which is hollow to conduct pressure fluid to operate the switches.

The switches can be connected in series or in parallel, or in series parallel, and can be located along a circle or along a straight row, or any other suitable configuration.

An accelerating member can be provided to exert an impact for rapid contact opening action.

The invention can be readily combined with an isolator arrangement as particularly described and claimed in our copending patent application No. 366,325, filed May 11, 1964.

Where the common insulating means comprises a fluid it is desirable to have access to the vacuum switches, for maintenance or replacement for instance, with the least disturbance of the insulating fluid. To this end it is advantageous to accommodate the vacuum switches in a housing, which itself is enclosed in an outer tank, the housing and the tank being filled with liquid insulant(s), and being interconnected to allow removal of the switches from the housing, while the space defined between the walls of the housing and tank remains closed.

Figure 1:
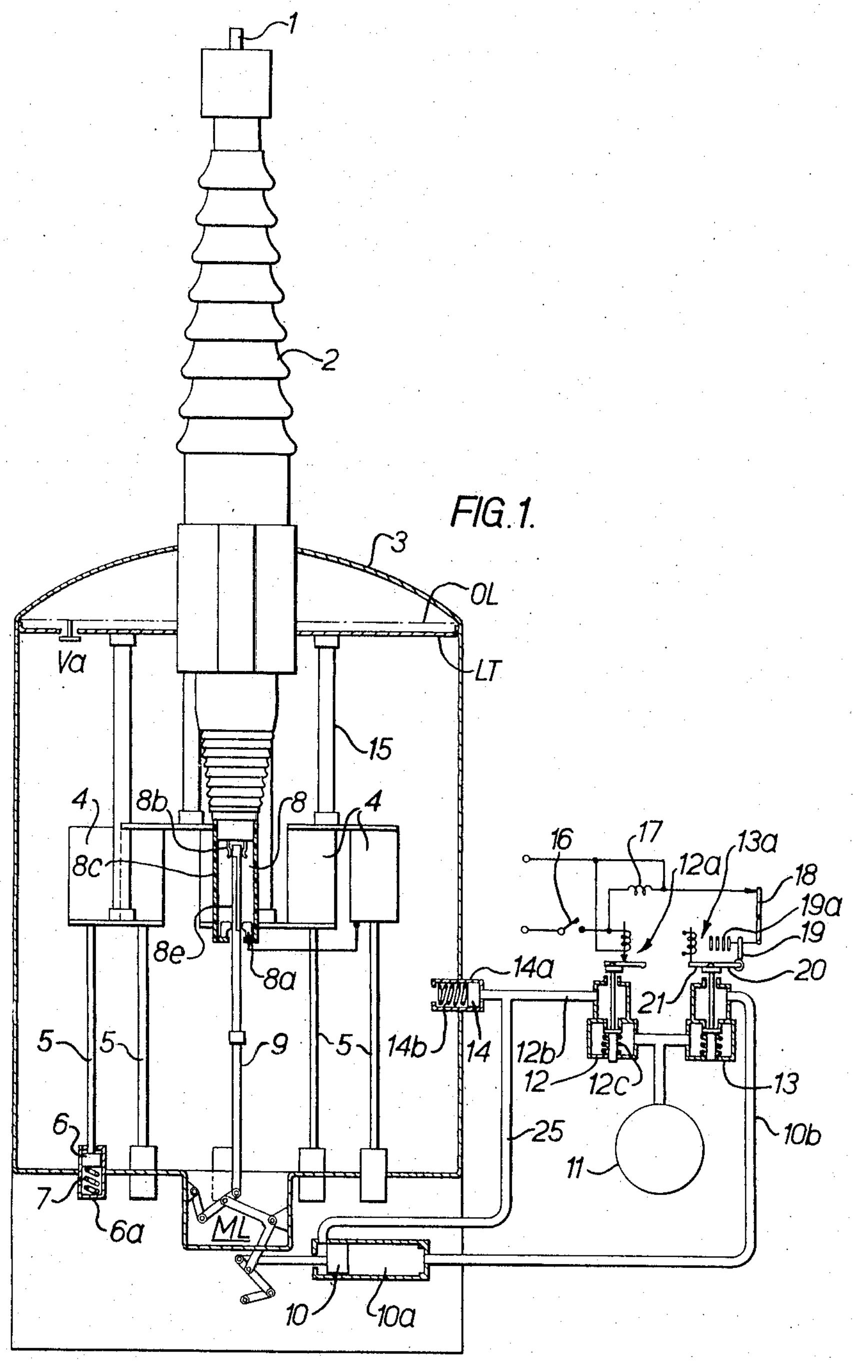
Figure 5:
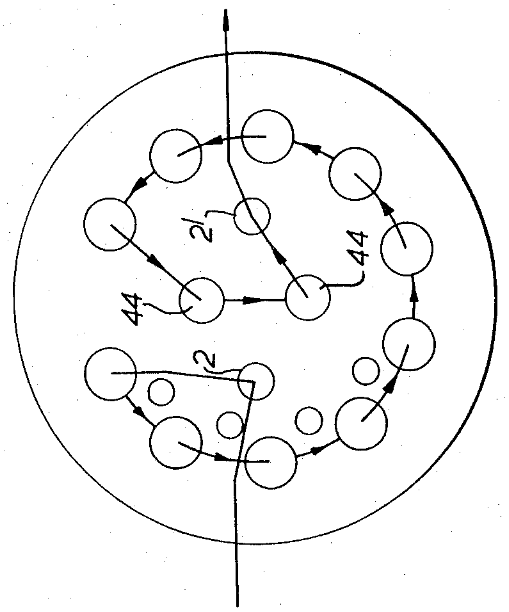
Figure 3:
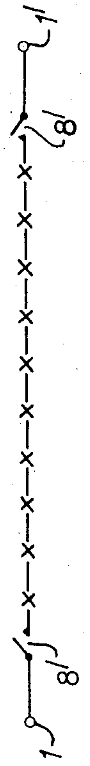
Figure 2:
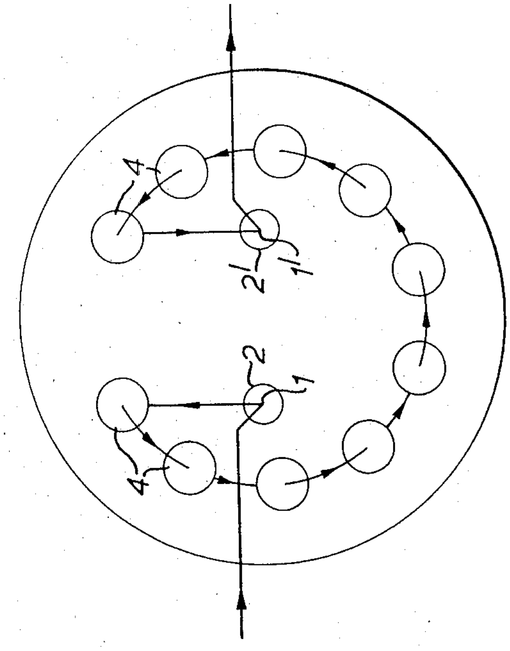
Figure 4:
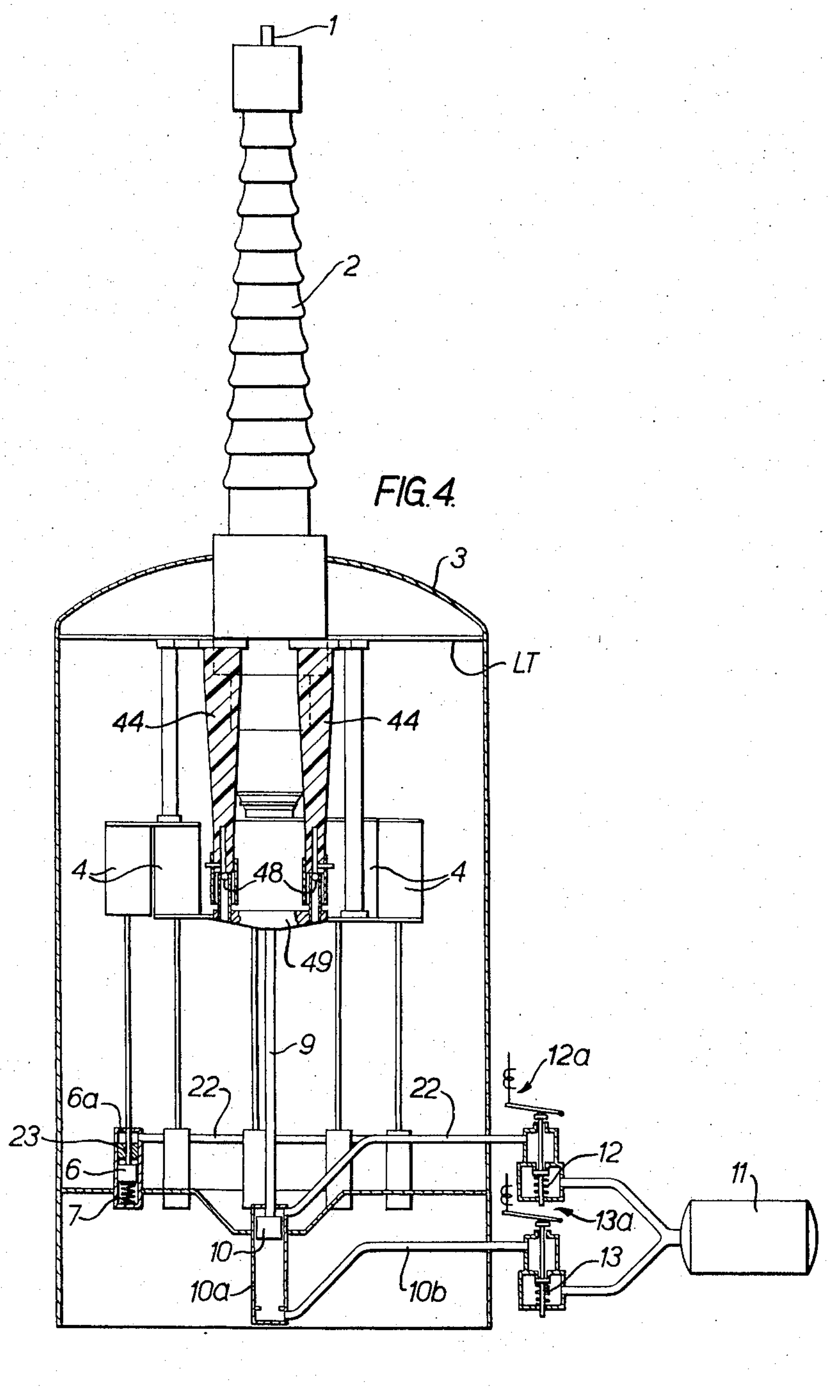

More details will become apparent and the invention will be better understood from the following description referring to the accompanying drawings, in which, FIG. 1 shows by way of example a switchgear embodying the invention, with a tank containing several vacuum switches immersed in oil which also transmits switch operating pressure, FIG. 2 is a plan showing diagrammatically the vacuum switches spaced from each other and situated along a circle, FIG. 3 shows diagrammatically the series connection of the several vacuum switches isolator contacts and end terminals, FIG. 4 shows a modified arrangement, where individual pipes conduct pressure medium to operating mechanisms of individual vacuum switches, FIG. 5 is a plan showing the location of the individual vacuum switches, isolators and main bushings of FIG. 4.

Figure 6:
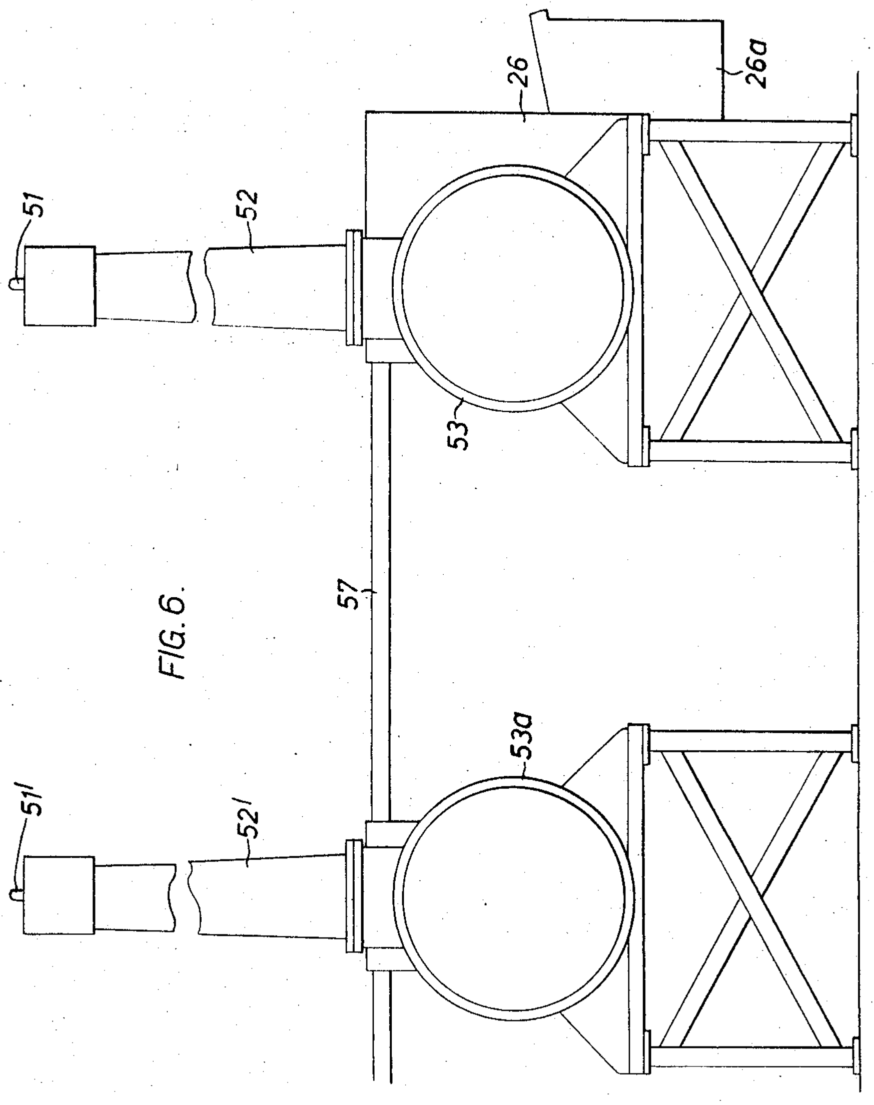
Figure 7:
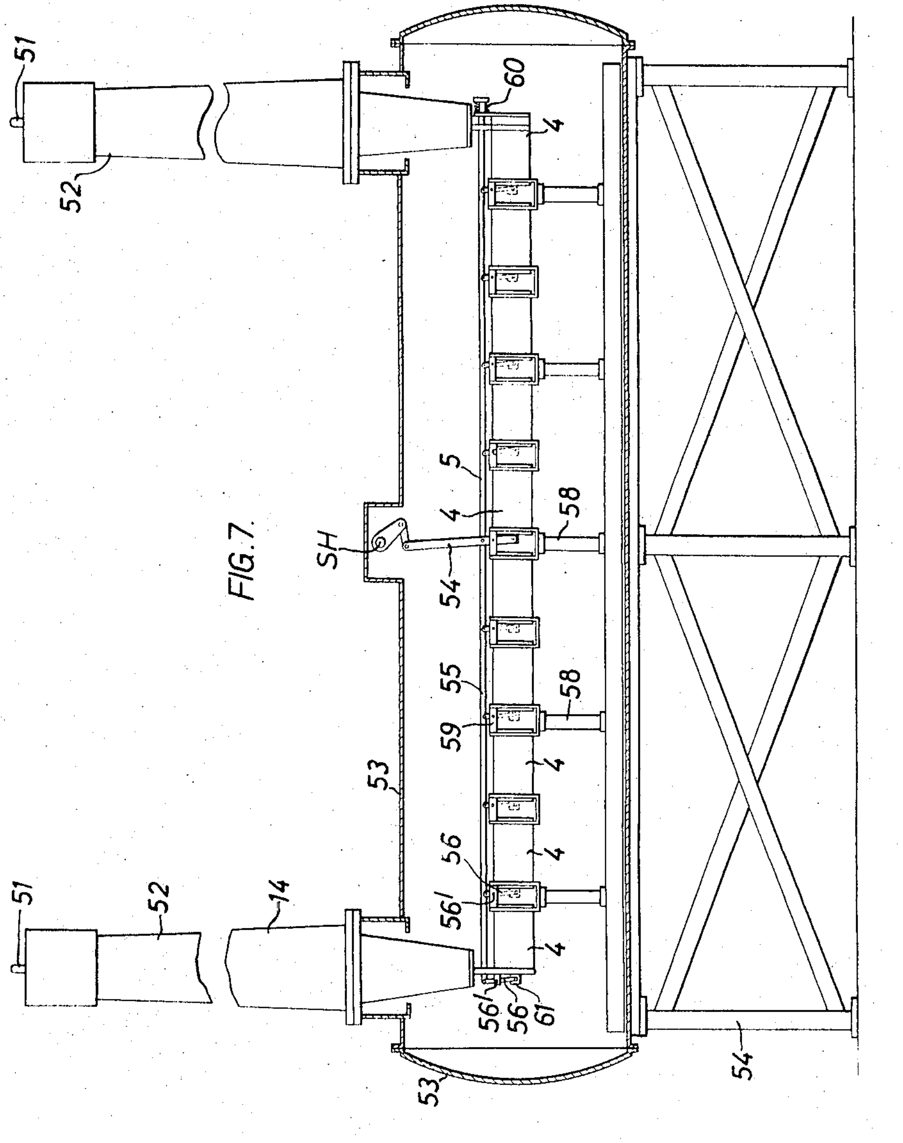
Figures 8, 9, 10:
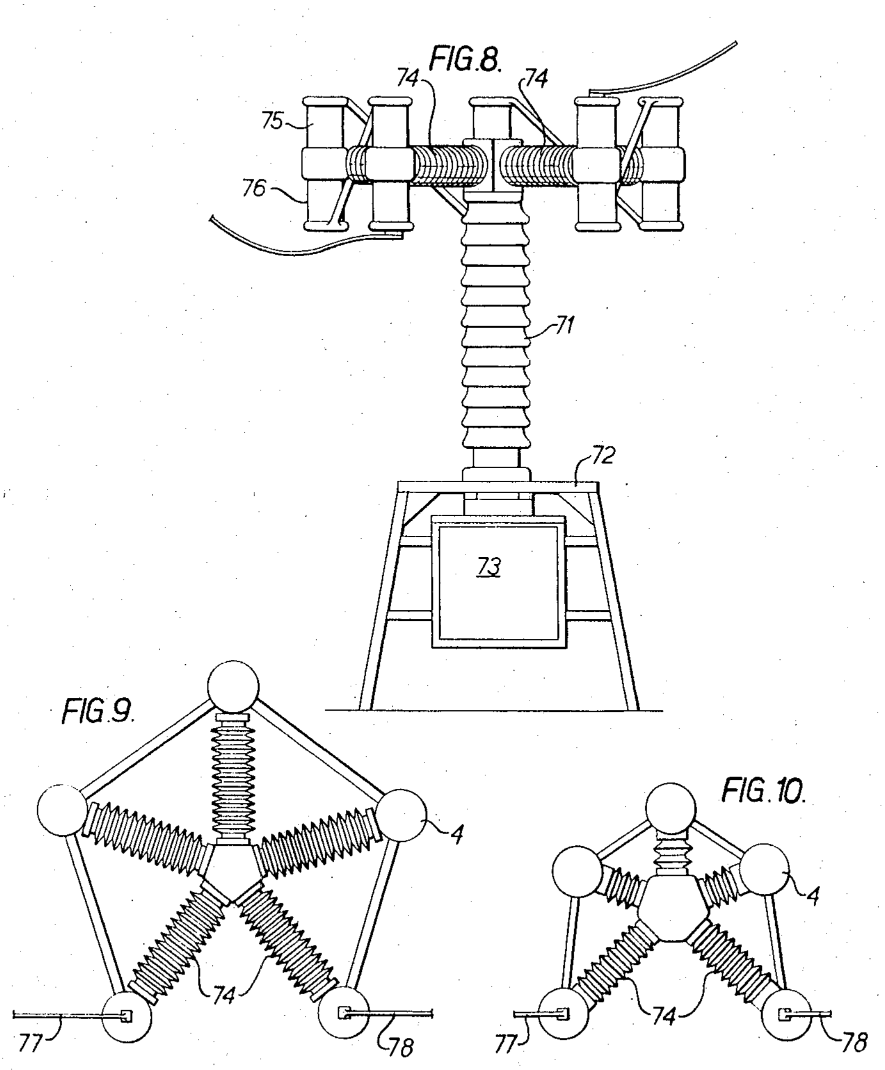
Figure 11:
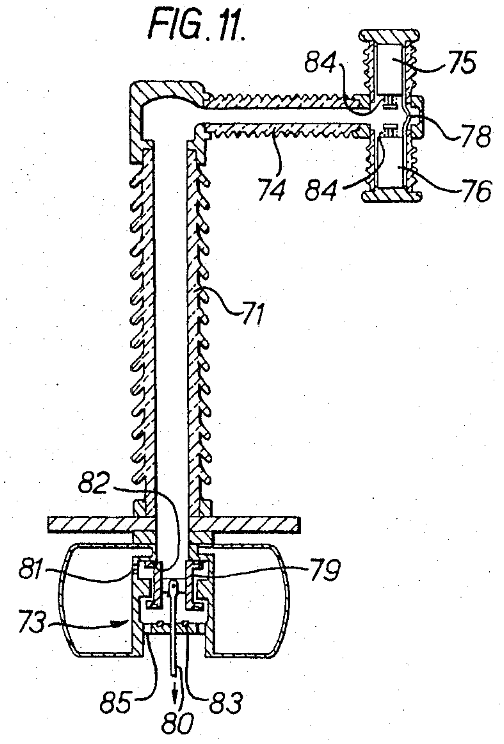
Figure 12:
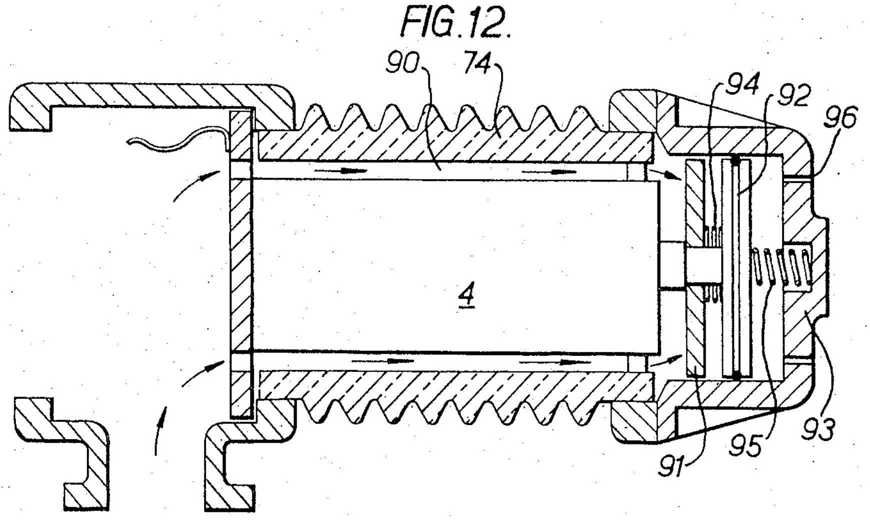

FIG. 6 shows two tanks each forming a single-phase switching unit of a polyphase assembly (two-phase in this case). As shown in FIG. 7 each tank has two bushed terminals and houses a group of vacuum switches which are located along a straight line in an elongate fluid-filled tank, FIGS. 8, 9 and 10 show in side view and elevation embodiments with a vertical hollow column forming the common insulating means. The several vacuum switches are supported by radial insulating arms which are of equal length in one embodiment and of different length in another embodiment, FIG. 11 shows in cross-section two vacuum switches at the end of a radial insulator, which is hollow to conduct pressure fluid from the column to the switches, FIG. 12 shows a vacuum switch in the hollow of a horizontal radial insulator, and an impact member for switch operation said member being movable in an end cap of the hollow insulator.

Figure 13:
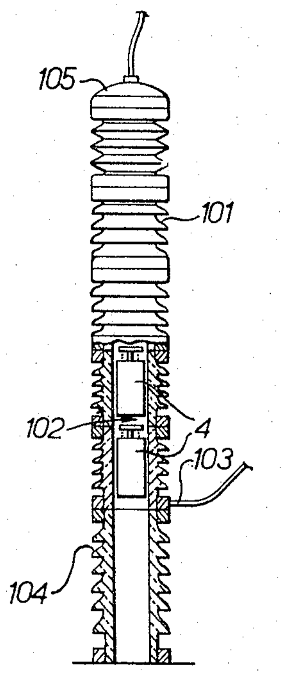

According to FIG. 13 several series connected vacuum switches (of which two are visible), occupy the upper part of a hollow insulator, the lower part of which represents the common insulating means of the switches.

Figure 14:
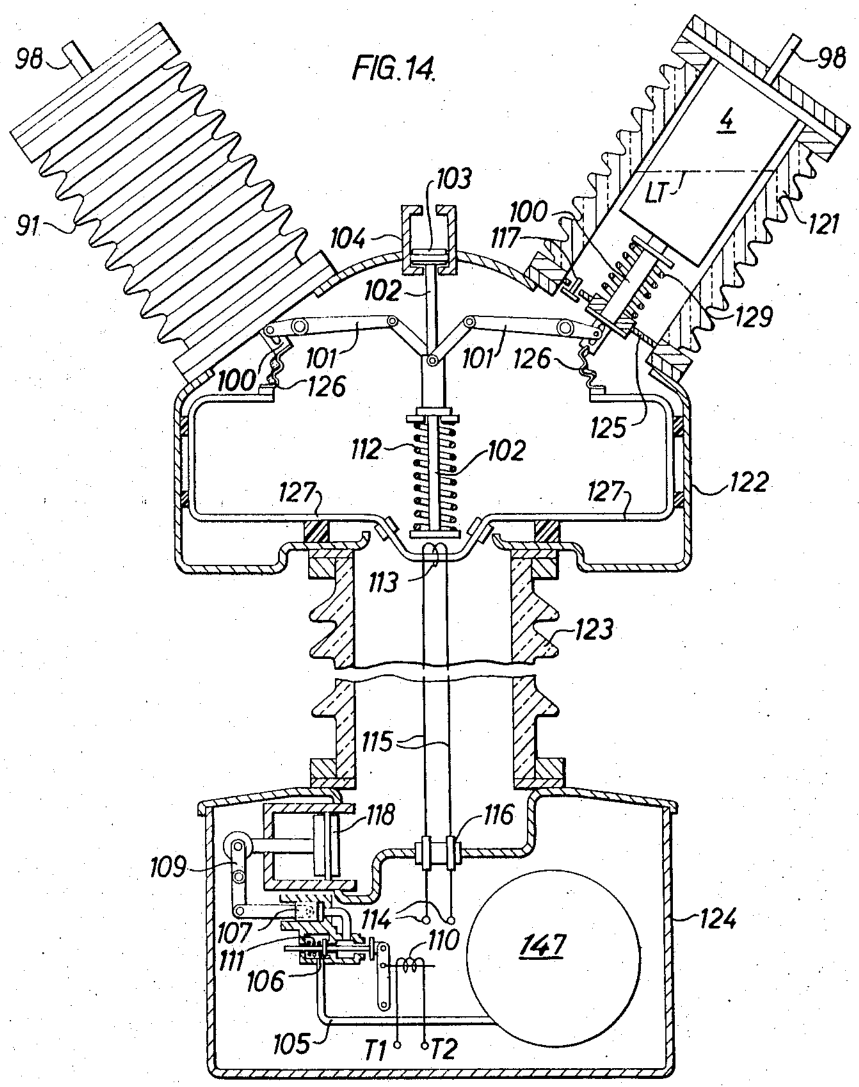
Figure 15:
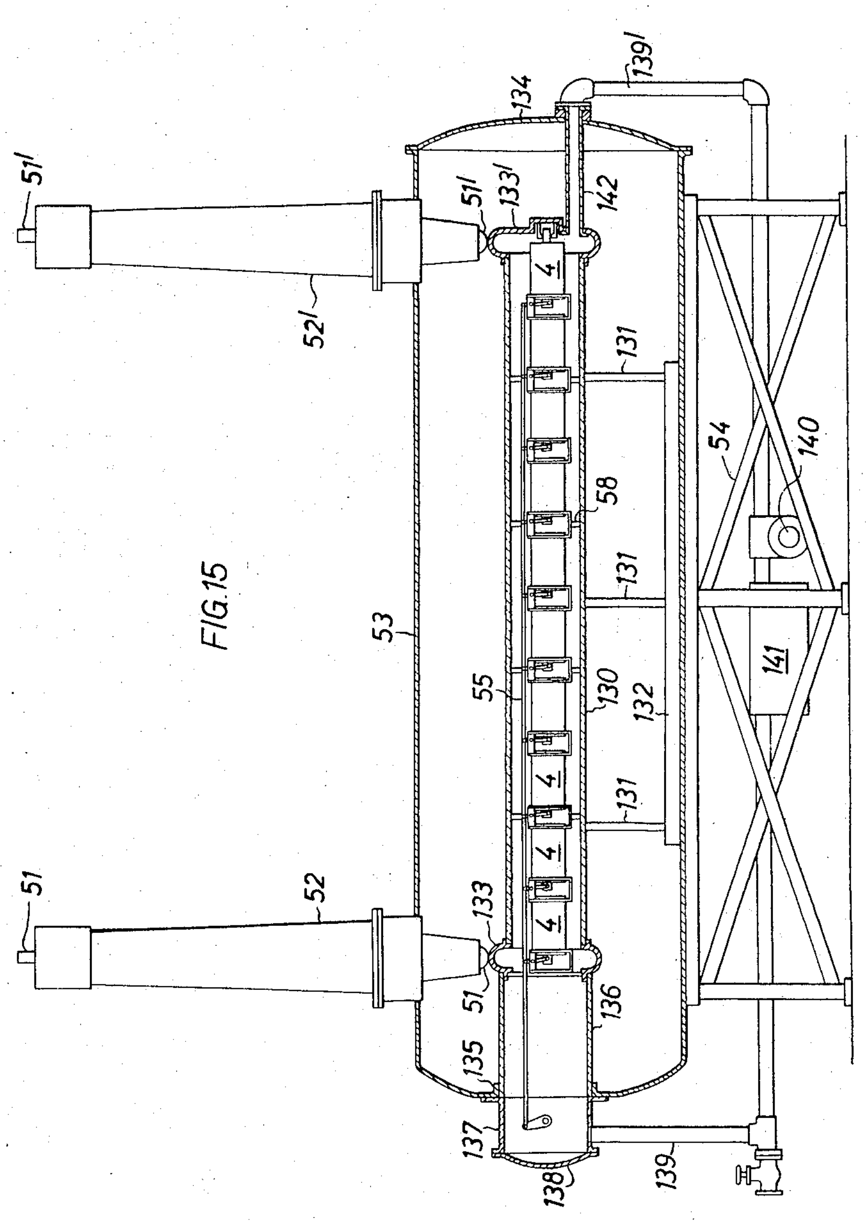

FIG. 14 shows series-connected vacuum switches enclosed in separate insulators mounted on a common metal casing on the top of a hollow insulator column, operation of the switches being controlled by changing the pressure of a quantity of insulating fluid in said column and casing, and FIG. 15 shows an embodiment provided with an intermediary housing between the series connected vacuum switches and an outer vessel to allow removal and replacement of the switches without disturbing a quantity of insulating fluid held between said housing and vessel.

Referring to FIGS. 1, 2 and 3 a number of vacuum switches 4, ten in this case, have each an envelope of insulating material, which is suspended by insulating rods 15 from the lower top LT of a metal double-top tank 3 which is earthed. The switches are located along a circle, and are series connected with each other. Main bushings 2, 2' insulate respectively incoming and outgoing through conductor terminals 1, 1' which are located inside the circle formed by the switches. Isolator switches or contacts 8, 8' are series connected between the terminals 1 and the group of vacuum switches as indicated in FIG. 3. The isolator switches are preferably mounted within the bushings 2, or at that end of the bushings which are inside the tank 3.

Each vacuum switch has a terminal at each of the two ends of its envelope. In this embodiment the envelopes are cylindrical and are vertically positioned. The lower end terminal of the vacuum switch at the end of the series connected switches is shown connected to a stationary isolator contact *8a* (FIG. 1) which is suspended by an insulating tube *8c* from the lower end of the terminal bushing 2 inside the tank 3. A tulip shaped second isolator contact *8b* is conductively connected to the terminal conductor 1. An electrically conducting rod *8e* vertically reciprocable by an electrically insulating rod 9, is slidable along contacts *8a* to form a bridging member between the contacts *8a* and *8b*. Thus an isolator is provided within the tank 3, and is adequately insulated while the wall of the tank is earthed. The level of oil in the tank is at OL, slightly higher than the position of the lower top LT of the tank 3. The lower top LT forms a partition between tank spaces below and above it and these spaces communicate through a one-way valve Va with each other.

Each vacuum switch is operable through an insulating rod 5 by a piston 6 which is reciprocable in a cylinder *6a*. The cylinder top communicates with the oil contents OL in the tank 3. The cylinder bottom is open to atmosphere and a compression spring 7 is provided between it and the piston. When pressure is applied to the oil contents OL it causes opening of each vacuum switch by downward movement of the piston 6 and rod 5 while retaining valve V*a* closed. When the pressure is released, the vacuum switch is closed by the spring 7 and valve V*a* opens.

A reservoir 11 for pressure gas communicates through a valve 12 and a pipe 12*b* with the closed end of a cylinder 14*a*, which is open at its other end. A piston 14 is reciprocable in the cylinder and is biased into the cylinder by a string 14*b*. The valve 12 is controlled by a trip coil 12*a*, the energising circuit of which includes a switch 16. When switch 16 is closed, the valve 12 opens against the bias of a spring 12*c*, and pressure fluid from the reservoir 11 moves the piston 14 inwardly relative to the tank. Thereby the pressure of the oil in the tank 3 is increased and causes switch opening through the pistons 6 as before described. When valve 12 closes the pressure of the oil in tank 3 is allowed to decrease, such as through a bleeding opening. Then the pistons 6 move upwards under the force of the springs 7 and the vacuum switches close.

The pressure from reservoir 11 also operates the isolator 8; a piston 10 reciprocable in a cylinder 10*a* moves, through a mechanical linkage ML, the rod 8*e* upwards, to close the isolator when pressure is applied to the right-hand end of the cylinder 10*a*, which communicates through a pipe 10*b* and a valve 13 with the reservoir 11. The left-hand end of cylinder 10*a* communicates through a pipe 25 with the pipe 12*b*. Thus when valve 12 opens to cause interruption of the vacuum switches, pressure is also applied to the left-hand end of piston 10 to open the isolator. A slight delay of the isolator operation relative to the switch operation ensures that the isolator contacts interrupt after the vacuum switch contacts have interrupted. When valve 12 is closed to reclose the vacuum switches, the isolator remains open until valve 13 is operated to move piston 10 under pressure derived from reservoir 11. Valve 13 is controlled by a coil 13*a*, but a locking means is provided to prevent closing of the isolator while a tripping operation of the vacuum switch is in progress. To this end the operating mechanism of valve 13 comprises a lever 21, the left-hand end of which is depressed when coil 13*a* is energised, while the right-hand end bears against a prop 19 which is biased by a spring 19*a* against the lower arm of a lever 18, the position of which is controlled by a coil 17. Coil 17 is connected in parallel to trip coil 12*a* to be energised when the trip coil is energised. When trip coil 12 is energised, coil 17 causes, through lever 18, displacement of prop 19 against the bias of spring 19*a*, thereby depriving the lever 21 of its stationary pivoting point so that valve 13 cannot open to reclose the isolator.

FIGS. 4 and 5 have parts corresponding to those of FIGS. 1 and 2 referenced by similar characters, and show a variation in which cylinders individually operating the several vacuum switches have pressure applied through a pipe line instead of through the insulating oil contents OL of the tank. The cylinders 6*a* have now closed upper ends communicating through a pipe line 22 and valve 12, with the pressure reservoir 11. A second piston 23 freely movable in the space between the piston 6 and the entrance opening of pipe 22, indicates an impact member. When pressure is applied to the upper end of cylinder 6*a*, piston 23 is accelerated to strike piston 6 with an impact, which ensures effective switch opening. The isolator operation is again controlled by a piston 10 movable in a cylinder 10*a* which has one end communicated through valve 12 and the other end communicated through valve 13 with pressure reservoir 11.

The isolator comprises here two stationary contacts 48 each supported by a post isolator 44 from the lower top LT of the tank. Closing of the isolator is effected by lifting a contact bridge 49 through the intermediary of insulating rod 9 as the piston 10 is raised consequent to the opening of valve 13. When valve 12 opens, piston 10 moves downwards, to cause delayed opening of the isolator after the vacuum switches have interrupted.

As shown in FIG. 5 several vacuum switches, ten in this case, are series connected as in the first embodiment, but two insulating posts 44 are indicated which carry the stationary isolator contacts 48 between the terminal bushing 2′ and the chain of vacuum switches.

According to FIG. 7 series connected vacuum switches 4 are arranged along a straight line in a fluid filled horizontal drum 53. The drum is supported upon a structure 54. Groups of vacuum switches, each group controlling one of the phases of a polyphase network are now accommodated in separate drums. Two parallel drums 53, 53*a* are shown in FIG. 6, but more drums can be used to suit the phase number of an individual installation. Each drum has terminals 51, 51′ supported by bushings 52, 52′. Each group of switches is operated here by a mechanical linkage comprising a reciprocable rod 55 parallel to the drum axis, operating levers 56, which individually control the movable contact in each vacuum switch. Each lever 56 rotates about a stationary pivot 56′ to reciprocate a member 61 which operates the movable contact in the switch. The rod 55 is biased by a spring 60 and is connected through a linkage 54*s* to a shaft SH. Mechanical interconnection is provided between the operating shafts of the several drums as indicated at 57 in FIG. 6. Insulating spiders or posts 58 are provided to support the envelopes 4 of the vacuum switches, for instance through the intermediary of strip-like constructions 59 between the envelopes of neighbouring switches. Casings 26, 26*a* house control gear operating the shaft SH.

FIGS. 8–11 show an embodiment in which the common insulation means of the vacuum switch envelopes against earth is provided by a hollow vertical insulating column 71, which is here supported on a structure 72. Five hollow insulators 74 arranged radially in a horizontal plane, have their inner ends supported at the top of column 71 and carry each at the outer end the vacuum switches. Preferably pairs of series connected vacuum switches 75, 76, as shown in FIG. 11, are provided so that the five arms carry a total of ten series connected switches as in the previous examples. The supporting arms 74 may be of similar length. Preferably, however, the arms which carry terminals 77, 78 for connection to an external circuit, are longer, as shown in FIG. 10, to provide for increased flashover strength.

Referring to FIG. 11 two vacuum switches 75, 76, series connected by a conductor 78, extend upwards and downwards at the outer end of the horizontal radial insulator 74. Switch operation is provided by pressure applied to a fluid, preferably liquid, in the continuous hollow formed by vertical insulating column 71 and horizontal insulator 74. In the present example the vacuum switches are closed as long as pressure is applied. A valve 73 at the lower end of hollow insulator column 71 controls this pressure by means of a piston 79 reciprocable by a rod 80. When rod 80 is pulled downwards, the piston engages a seat 83 and prevents pressure escape through holes 85, while pressure fluid flows from container 11 through ports 81 and past a seat 82 of the valve, to increase the pressure in the vertical column 71 and horizontal arm 74, for closing action of the vacuum switches 75, 76. When piston 79 is moved upwards by rod 80, it bears against the seat 82 and cuts the communication with reservoir 11 whilst opening the communiation to atmosphere past seat 83 and through holes 85. When the pressure in the hollow of parts 71, 74 is thus released, springs 84 cause opening of the vacuum switches 75, 76.

A pressure vessel could be mounted on top of the hollow vertical insulator column 71 immediately beneath the junction of the horizontal insulators 74. The rod 80 would then project through the insulator column 71 to control the valve operating mechanism.

A switch opening impact member is indicated in FIG. 12. Pressure fluid, such as air, is conducted through an annular spae 90 between the envelope of a vacuum switch 4 and a hollow insulator 74, to a hammer piston 91 which is slidable on a hub portion of an operating piston 92, enclosed in a cap 93 at the outer end of the hollow insulator 74. A weak spring 94 is arranged between the pistons 91, 92, and a much stronger spring 95 biases the piston 92 against spring 94. Bleeding openings 96 are provided in the closing cap 93. When pressure is applied through channel 90 to member 91 it accelerates and strikes the operating piston 92 with hammer action for effective contact opening. As long as the pressure is maintained the switch contacts are held open. When the pressure is released, the switch closes under the bias of spring 95.

Alternatively vacuum switches can be arranged in the hollow of a vertical insulator or column, as shown in FIG. 13: several vacuum switches 4 are arranged one above the other in the hollow of a vertical insulator 101. Of these switches two are shown, series connected by a flexible conductor 102. Outer terminals 103, 105 are provided at the lower and upper ends of insulator 101. Another hollow insulator 104, which represents the common insulation against earth of the vacuum switches, supports the insulator 101.

Referring to FIG. 14 vacuum switches 4 are enclosed each in a hollow insulator 121, said insulators being mounted on the top of a common casing 122 of metal, such as steel. A hollow insulator column 123 supporting the casing 122 is itself supported by an earthed metal housing 124. A diaphragm 125 separates the hollow of insulator 121 from the casing 122, and a one-way valve 117 arranged to be closed by pressure increase in casing 122, is provided in the diaphragm 125. Electrically conducting actuating rods 100 carrying the movable contacts of the vacuum switches, are series connected through flexible conductors 126, and a rigid conductor 127 which is insulatingly supported in the casing 122. External terminals 98 at the outer ends of the insulators 121, are provided for connection of the stationary contacts of the vacuum switches to an external circuit. Similarly arranged pairs of series connected vacuum switches or vacuum switch groups can be employed for a very high voltage circuit breaker.

The insulating fluid filling casing 122 and column 123 may be liquid, and may comprise oil. The lower end of each insulator 121 then contains the liquid level indicated at LT, so that the lower portions of the vacuum switches are immersed.

Each vacuum switch is biased to its closed position by a coil spring 129 surrounding the rod 100, which latter projects into the casing 122. For opening each vacuum switch, rod 100 is pulled through a mechanical linkage 101 by upward movement of a vertical rod 102 connected to a piston 103 which is reciprocable in a cylinder 104. The lower end of cylinder 104 communicates with the casing 122 so that pressure increase in the casing 122 causes switch opening. A pressure reservoir 147 in the housing 124 which forms the base of the column 123, communicates through a pipe 105 and a control valve 106 with one end of a cylinder in which an actuating piston 107 is reciprocable. A pressurising piston 118 is operable by the piston 107 through a two-arm lever 109 to increase the pressure in column 123 and casing 122. The valve 106 is controlled by a coil 110 which is connectible through terminals T1, T2 to a tripping circuit. Thus when coil 110 is energised the piston of valve 106 moves to the left allowing pressure fluid to flow from reservoir 147 to the cylinder of actuating piston 107, and pressurising piston 118 is moved to the right, thereby increasing the pressure in column 123 and casing 122. The valve 117 now closes, piston 103 moves upwards and causes opening of the vacuum switches through the linkage 101.

When coil 110 is de-energised a biasing spring 111 moves the valve piston 106 to the right, whereby to interrupt the communication to pressure reservoir 147 and open a communication to the outer atmosphere. Now the pressure in column 123 and casing 122 returns to normal, and the spring 129, aided by a spring 112 biasing downwards the rod 102, causes closure of the vacuum switch.

A secondary winding 113 of a current transformer coupled electromagnetically to the conductor 127 has its ends connected to external terminals 114 by conductors 115 which are insulated in a wall separating the column 123 from the housing 124, using a terminal board or bushings 116.

The vacuum switches are connected in series with isolator contacts, which are not shown in FIG. 14 for the sake of brevity, but may comprise an arrangement as described in conjunction with the other embodiments, or may be of conventional construction.

Referring to FIG. 15 two or more (ten in this case) vacuum switches 4 are electrically series connected, and positioned on a straight line within a housing 130 of tube or shell shape and made of insulating material. The housing 130 is supported in a drum-shaped tank 53 by posts 131 mounted on a base 132, the posts and base being made of insulating material. As previously explained with reference to FIG. 7 the vacuum switches of the group are simultaneously operated by a rod 55, the drum is supported upon a structure 54, the vacuum switches are supported by spiders 58, and terminals 51, 51′ are brought out of the tank through bushings 52, 52′. In the embodiment of FIG. 15 the inner ends of the terminal conductors engage contacts 133, 133′ which are formed by metal rings joined to the two ends of the tubular housing 130, and are connected to the end terminals of the series of vacuum switches. The drum 53 has its right-hand end closed by a removable cover 134 and the shell 130 has its right-hand end closed by the member 133′. The left-hand end of the tubular housing or shell 130 is open and at the left-hand end of the drum 53 an opening 135 smaller than the cross section of the drum is provided to allow removal of the vacuum switches without disturbing the insulating fluid in the tank 53. A sleeve or duct 136 of insulating material provides a passage between the opening 135 and the member 133 at the left-hand end of the shell 130. A hollow metal end cap 137 communicates with and projects outwardly from the opening 135, and has its outer end closed by a detachable cover 138. Thus vacuum switches can be removed and replaced after the contents of an insulating and cooling medium, which may be liquid or gaseous, is drained from shell 130 only, without disturbing the insulating medium which also serves for cooling and fills the space between the drum 53 and the shell 130. For more effective heat transfer from the vacuum switches a circulating pump 140 and a cooling radiator 141, outside the tank 53 are arranged to communicate through a pipe 139 with the cap 137, and through a pipe 139′ with a tube 142 of insulating material which connects a port in the member 133′ with an opening in the cover 134 at the right-hand end of the drum 53.

While preferred embodiments have been described and shown it will be understood that variations are possible without departing from the invention. Where several switches are connected in series, means known in the art, such as capacitors or resistors, can be connected in parallel to the contact gaps for appropriate voltage division. While a simple hammer member has been shown, more sophisticated impact arrangements can be used. Any one of the vacuum switches shown can comprise two or more contact pairs connected in series or in parallel and enclosed in a common envelope. Groups of vacuum switches which are in series or in parallel, or in series-parallel, can be substituted for each single vacuum switch shown, for instance in the embodiment of FIG. 14.

The insulating mediums in the tank 53 and housing 130 may be liquid or gaseous, similar or dissimilar. The vacuum switches need not be positioned along a circle or a straight line and the opening 135 of an arrangement according to FIG. 15 allowing the passage of vacuum switches may be at the top of a tank. The tank 53 need not be of drum shape and its main axis need not be horizontal. A frame structure can hold some or all the switches 4 of a group, such as in the embodiment of FIG. 15, to allow their simultaneous removal and replacement.

What we claim is:

1. A high voltage power switch gear comprising at least two contact pairs individually enclosed in separate series connected units which are evacuated and virtually free of fluid, said units being enclosed in a first, sealed inner container which is supported in, and electrically insulated from a second, sealed outer metal container which encloses said first container, said containers having aligned openings, the edge of the opening of the outer container being sealed to the wall of the first container, said openings being dimensioned to allow passage of the said units therethrough, a removable covering being provided for the opening of the inner container, insulating fluids filling, at least partly, the free spaces between the said containers, and within the inner container, terminal conductors extending through and insulated from a wall of the outer container, the inner container having a wall portion of non-conducting material separating and insulating a pair of end terminals from each other, said terminals being detachably connected to said terminal conductors and to end terminals of the series connected units.

2. A high voltage power switch gear comprising at least two contact pairs hermetically sealed in separate series connected interrupting units which are evacuated and virtually free of fluid, both units being enclosed in a sealed inner container which is supported in, and electrically insulated from a sealed outer container of metal which encloses said first container, the wall of the inner container separating completely from each other the spaces in the two containers, the space between the two containers being larger than that in the inner container, both containers having aligned openings, the edge of the opening of the outer container being sealed to the wall of the inner container to accomplish the said space separation, said aligned openings being dimensioned to allow passage of the said units therethrough, a removable covering being provided for the opening of the inner container, and quantities of insulating fluids being contained respectively between the said containers, and within the inner container.

3. A switch gear as claimed in claim 2 wherein the opening of the inner container is at the end of an extension which is made of insulating material, and is coaxial with a tubular main portion of the inner container, said extension projecting through the opening of the outer container.

4. A switch gear as claimed in claim 2 wherein terminal conductors extend through and are insulated from a metal wall of the outer container, the inner container having two wall portions made of conducting material, a wall portion of non-conducting material separating and insulating said conducting portions from each other, said conducting wall portions being connected to the said terminal conductors and to end terminals of the series connected units.

5. A switch gear as claimed in claim 2 having a heat exchanger and a pump, both situated externally of the outer container and communicating through pipes with the insulating fluid in the inner container.

References Cited by the Examiner

UNITED STATES PATENTS

| | | | |
|---|---|---|---|
| 1,801,736 | 4/1931 | Greenwood | 200—144 |
| 2,162,588 | 6/1939 | Prince | 200—150 |
| 2,239,554 | 4/1941 | Duffing | 200—150 |
| 2,724,756 | 11/1955 | Gieffers | 200—150 |
| 2,850,600 | 9/1958 | Prince | 200—150 |
| 3,007,021 | 10/1961 | Prunty et al. | 200—150 |
| 3,177,326 | 4/1965 | Roxburgh et al. | 200—150 |

FOREIGN PATENTS

| | | |
|---|---|---|
| 605,246 | 11/1934 | Germany. |

ROBERT K. SCHAEFER, *Primary Examiner.*

KATHLEEN H. CLAFFY, *Examiner.*

P. E. CRAWFORD, R. S. MACON, *Assistant Examiners.*